US006870368B2

(12) United States Patent
Visser et al.

(10) Patent No.: US 6,870,368 B2
(45) Date of Patent: Mar. 22, 2005

(54) MRI APPARATUS AND METHOD FOR SELECTIVELY ROUTING/DIVERTING AND COMBINING SIGNALS ALONG DIFFERENT PATHS

(75) Inventors: Frederik Visser, Eindhoven (NL); Paulus Cornelius Hendrikus Adrianus Haans, Eindhoven (NL); Johan Samuel Van Den Brink, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/067,429

(22) Filed: Feb. 5, 2002

(65) Prior Publication Data

US 2002/0125888 A1 Sep. 12, 2002

(30) Foreign Application Priority Data

Feb. 9, 2001 (EP) .......................................... 01200494

(51) Int. Cl.[7] ................................................ G01V 3/00

(52) U.S. Cl. ....................................... 324/318; 324/309

(58) Field of Search ................................ 324/309, 307, 324/322, 318, 300; 600/422

(56) References Cited

U.S. PATENT DOCUMENTS 5,160,891 A 11/1992 Keren ........................ 324/318
5,370,118 A * 12/1994 Vij et al. .................... 324/318
5,399,970 A 3/1995 Pele et al. .................. 324/309
5,664,568 A * 9/1997 Srinivasan et al. ......... 600/422
5,861,749 A * 1/1999 Van Heelsbergen ......... 324/322
5,951,474 A * 9/1999 Matsunaga et al. ......... 600/422
6,356,081 B1 * 3/2002 Misic ......................... 324/318
6,377,044 B1 * 4/2002 Burl et al. .................. 324/307
6,469,506 B1 * 10/2002 Felmlee et al. ............. 324/309
6,549,799 B2 * 4/2003 Bock et al. ................. 600/422
2002/0156362 A1 * 10/2002 Bock et al. ................. 600/410

FOREIGN PATENT DOCUMENTS

EP 0472390 A2 2/1992 ........... G01R/33/54

OTHER PUBLICATIONS

Sodickson et al., "SMAH Imaging," Magnetic Resonance Imaging, vol. 7, No. 2, May 1999, pp. 237–254.

"Sense: Sensitivity Encoding for Fast MRI", by Klaas P. Pruessmann et al., Magnetic Resonance in Medicine 42:952–962 (1999).

* cited by examiner

*Primary Examiner*—Diego Gutierrez
*Assistant Examiner*—Tiffany A. Fetzner
(74) *Attorney, Agent, or Firm*—John Vodopia

(57) ABSTRACT

The proposed MRI apparatus provides a solution to the problem of a limited number of receiver channels. The main idea is to make use of the imaging parameters when selecting and/or combining the RF signals of at least two RF coils into separate receiver channels. Such an imaging parameter may be, for example, the phase encoding direction.

16 Claims, 5 Drawing Sheets

MRI APPARATUS AND METHOD FOR SELECTIVELY ROUTING/DIVERTING AND COMBINING SIGNALS ALONG DIFFERENT PATHS

FIELD OF THE INVENTION

The present invention relates to a magnetic resonance imaging (MRI) apparatus and to a magnetic resonance imaging method. Such an MRI apparatus and MRI method are generally known and widely used. Therein a magnet is used for generating a temporally constant, uniform magnetic field in an examination region, and a radio frequency (RF) unit comprising an RF coil system is used for transmitting radio frequency signals into the examination region to induce and manipulate magnetic resonance of dipoles disposed in the examination region and/or for receiving RF signals from the dipoles disposed in the examination region.

BACKGROUND OF THE INVENTION

The article "SENSE: Sensitivity Encoding for Fast MRI", by Klaas P. Pruessmann et al., Magnetic Resonance in Medicine 42:952–962 (1999) describes a concept for considerably enhancing the performance of magnetic resonance imaging by means of arrays of multiple receiver coils. It discloses sensitivity encoding (SENSE) which is based on the fact that receiver sensitivity generally has an encoding effect complementary to Fourier preparation by linear field gradients. The use of an array of simultaneous receiver coils enables the scan time to be reduced and the resolution to be increased. The described method takes advantage of undersampling or reduction of k-space samples and also of known individual coil sensitivity profiles. Since sampling is performed with a step size larger than prescribed by the Nyquist theorem, the so-called foldover occurs during the (always necessary) Fourier transformation, so that in principle two different points from the physical image space cannot be distinguished from one another.

In practice the anatomical region to be examined asks for more coil elements and receiver channels that are provided as hardware in the MRI apparatus. An MRI apparatus produced and sold by Philips, that is, the Gyroscan NT which is also used in practice, can handle up to six synergy/phased array coils simultaneously by using six receiver channels, but certain applications could require more receiver channels and RF coils. If there are more RF coils than receiver channels, it is necessary to select coils for allocation to the available receiver channels. A larger number of receiver channels is possible in principle and would lead to shorter acquisition times or higher resolutions. But each additional receiver channel increases the costs of an MRI apparatus considerably, and each change in the number of receiver channels necessitates a redesign of the entire system, because more bandwidth is then required.

SUMMARY OF THE INVENTION

It is, therefore, an object of the present invention to provide an MRI apparatus and an MRI method that solve the above-mentioned problems, in particular the problem of a limited number of receiver channels and a greater number of RF coils.

This object is achieved by a magnetic resonance imaging apparatus as claimed in claim 1, comprising:

an RF coil system comprising at least two sets of at least two RF coils for detecting RF signals from a region of interest, at least two receiver channels for receiving and processing the detected RF signals, and a control unit for selecting and/or combining the RF signals of at least two RF coils depending on the imaging parameters and for applying the selected and/or the combined RF signals to separate receiver channels.

The invention is based on the idea that the user of the MRI apparatus must be able to choose which and how many individual smaller RF coils are to be selected and/or combined to as to effectively encompass and probe the region of interest and to input the RF signals of the selected and/or combined coils into separate receiver channels. Depending on the specific examination, in particular the anatomical region to be examined and the specific method of examination, the user must be able to choose the foldover direction or SENSE reduction direction that is best for the relevant examination. This direction then determines the combination of the smaller coils into larger elements. The direction is known to be manifold in different examinations of the same region. A fixed hardware combination of several small loops forming RF coils into one larger loop forming an RF coil is, therefore, not desirable. This would require an exchange of coils for different scans within one examination. In particular, in transversal slices left-right foldover is anatomically preferred in most scans except for Echo Planar Imaging (EPI) scans where anterior-posterior foldover is preferred. Generally speaking, Echo Planar Imaging scans are more sensitive in the phase-encoding direction, i.e. the slow-scan-direction, to backfolding artifacts.

In contrast therewith, according to the invention a variable, preferably software-controlled control unit is provided for selecting and/or combining the RF coils, i. e. the phased array/synergy coils, depending on the imaging parameters.

According to the invention a selection and/or combination of RF coils is based on known imaging parameters of the relevant examination, which imaging parameters can be, for example, the foldover direction or the reduction direction as described in the above-mentioned article. Furthermore, the kind of examination concerned and the arrangement and the properties of the RF coils shall be understood as imaging parameters.

The invention thus enables only the most appropriate RF coils or, in the case of a combination, more RF coils than existing receiver channels to be used for detecting RF signals from the region of interest (the region to be examined, e.g. a part of a patient), while maintaining the flexibility to vary the preferential sensitivity direction in an xyz-coordinate system for different scans within one examination.

In a preferred embodiment of the invention said control unit is provided for combining the RF signals of several groups of at least two RF coils into a separate receiver channel. In order to enable SENSE in one direction, two or more independent receiver channels (for more than two images) are needed so as to be combined into one image using the SENSE algorithm. These two (or more) different receiver channels require two (or more) different sensitivity profiles. Such a sensitivity profile can be obtained from one coil or from two (or more) electrically combined RF coils.

To enhance scan speed or spatial resolution even more the SENSE principle can be used in two directions. This will lead to backfolding in two directions in the individual receiver channels. Consequently, using the SENSE principle in two directions more RF coils or sensitivity profiles are needed. Since these two directions are not (exactly) known beforehand, at least two coils or two sensitivity profiles are needed in each xyz-direction, leading to a minimum of eight RF coils in a volumatic position.

In another preferred embodiment said RF coil system comprises two sets of four RF coils. Some anatomical regions such as the head demand a configuration of a set of multiple RF coils arranged around the object, e.g. around the head. Preferably, an arrangement of eight coils is used in particular for examining the head, which coils are preferably arranged in the form of a birdcage head coil arrangement.

For such a head coil arrangement it is also preferred to combine either the RF signals of RF coils arranged on opposite sides of the head or to combine the RF signals of neighbouring RF coils. The choice of the RF signals to be combined depends on the details of the head coil arrangement and on the imaging parameters, e.g. the desired reduction direction.

According to another aspect of the invention said control unit is provided for selecting and/or combining the RF signals of at least two RF coils in dependence on the phase encoding direction or, according to still another aspect of the invention, depending on the desired SENSE reduction direction.

The object is also achieved by a magnetic resonance imaging method as claimed in claim 9, comprising the steps of:

detecting RF signals from a region of interest while using an RF coil system comprising at least two sets of at least two RF coils, receiving and processing the detected RF signals while using at least two receiver channels and selecting and/or combining the RF signals of at least two RF coils depending on the imaging parameters and applying the selected and/or the combined RF signals to separate receiver channels. It is to be understood that this method can be developed further and that further versions are feasible which are compatible with or similar to those described with reference to the MRI apparatus as claimed in claim 1.

BRIEF DESCRIPTION OF THE DRAWINGS

The invention will now be described in more detail with reference to the drawings in which.

DETAILED DESCRIPTION OF THE PREFERRED EMBODIMENTS

Figure 1:
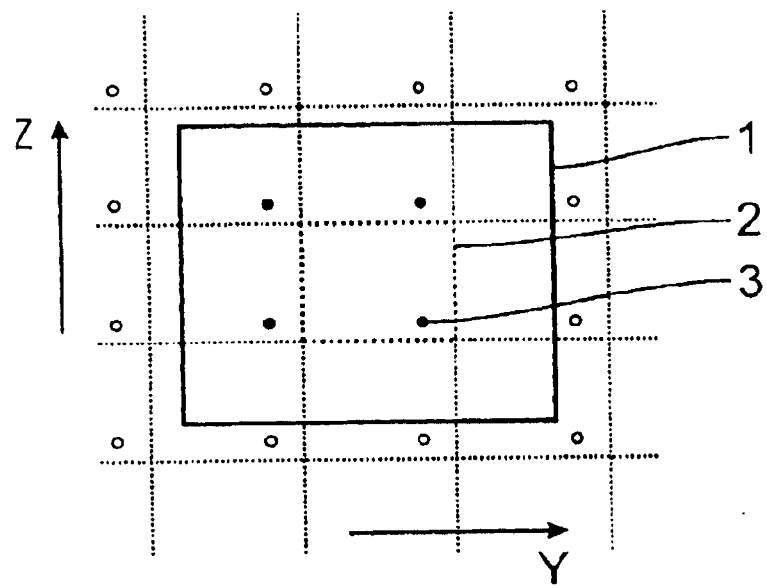
FIG. 1 shows a diagram explaining given terms used to describe the invention.

FIG. 1 shows a diagram explaining several terms used to describe the invention. This Figure shows a two-dimensional cartesian grid which is arranged in the z-y-direction. The z-direction can be regarded as the slice selection direction, and the y-direction can be regarded as the phase encoding direction. The known method utilises sensitivity encoding and takes advantage of undersampling or reduction of k-space samples and known individual coil sensitivity profiles. The full field of view (FOV) 1 is thus reduced in both dimensions. A pixel 3 in the reduced FOV 2 represents the superposition of pixels forming a cartesian grid. In the example shown in FIG. 1 four of these pixels are in the full FOV 1; thus the actual degree of aliasing is four. Aliased pixels are thus created in the individual coil reconstructed images which can, however, be unfolded by making use of the different sensitivity profiles of each coil. There are a few constraints on this aspect: reduction of k-space samples, using SENSE, and subsequent effective unfolding of the image can only be achieved in the direction of multiple receiver coils, i.e. in the reduction direction. The SENSE reconstruction algorithm will unfold the image. Aliasing or foldover artefacts are thus created in the same direction, i.e. in the foldover direction.

Figure 2:
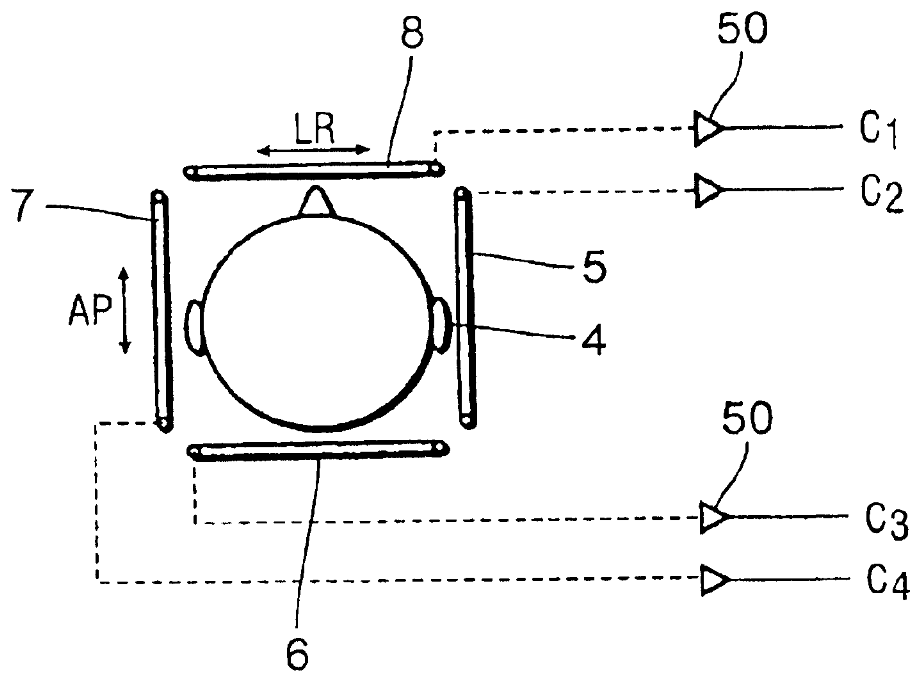
FIG. 2 shows a first embodiment of a head coil arrangement comprising four RF coils.

FIG. 2 shows a first embodiment of an RF coil system according to the invention. Two sets of RF coils, each set comprising two RF coils, are arranged around the head 4 of a patient to be examined. In practice the user wishes to choose the ear to ear direction as the foldover direction for the head, because often the width of the head is smallest in this direction. The user has also reasons for choosing the foldover direction arbitrarily with a view to the signal-to-noise ratio (S/N ratio) and the direction of the desired slice to be imaged. Therefore, use is made of the two sets of coils as shown in FIG. 2, that is, one set of LR (=left/right) coils 5, 7 and one set of AP (=anterior/posterior) coils 6, 8. Furthermore, each RF coil 5, 6, 7, 8 is provided with a separate preamplifier 50, each of which defines a separate receiver channel C1, C2, C3, C4.

If use is made of the known method of sensitivity encoding (SENSE) the direction in which the SENSE reduction axes are situated is known, so that the focus orientation of the coil combination of two from four coils is defined. Using an RF coil system as shown in FIG. 2 in one direction SENSE for AP use the channels one and four C1, C4 are selected and used separately, i.e. the RF signals thereof are applied to separate receiver channels, while for LR use the channels two and three C2, C3 are selected and used separately according to the invention. In two directions SENSE all four channels are selected and used separately.

Figure 3:
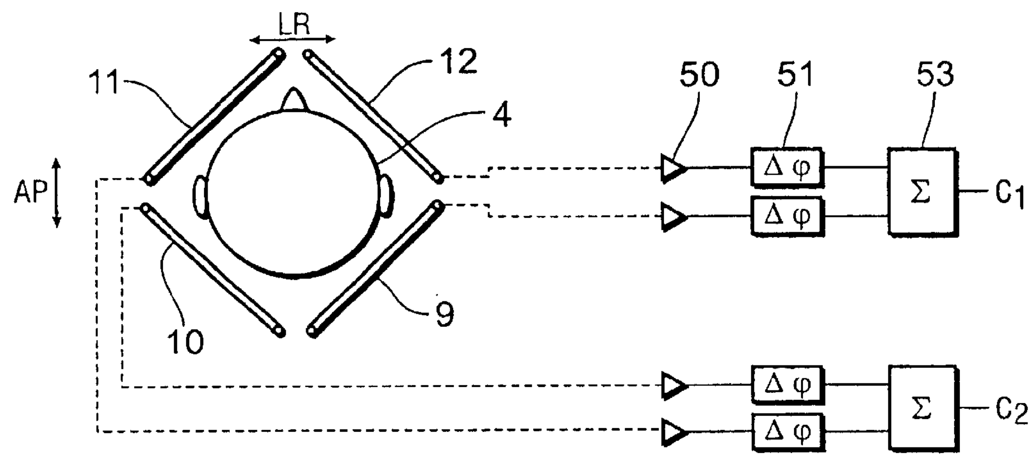
FIG. 3 shows a second embodiment of a head coil arrangement comprising four RF coils.

Another embodiment of an RF coil system according to the invention is shown in FIG. 3, it also comprises four RF coils 9, 10, 11, 12 which are arranged around the head 4 of a patient. Compared to the embodiment shown in FIG. 2, the RF coils 9, 10, 11, 12 are angulated by 45°. Again, each RF coil 9, 10, 11, 12 is provided with a separate preamplifier 50, each of which is succeeded by a phase shifter 51.

For LR SENSE, i.e. if the reduction direction is LR, the output signals of the RF coils 9 and 12 are combined into one receiver channel C1 by use of an RF adder/combiner 53, and the output signals of the RF coils 10, 11 are combined into a second receiver channel C2 by a second RF adder/combiner 53. For AP SENSE the outputs of the RF coils 11, 12 are combined into a first receiver channel and the outputs of the RF coils 9, 10 are combined into a second receiver channel, these combinations are not shown in FIG. 3.

Figure 4:
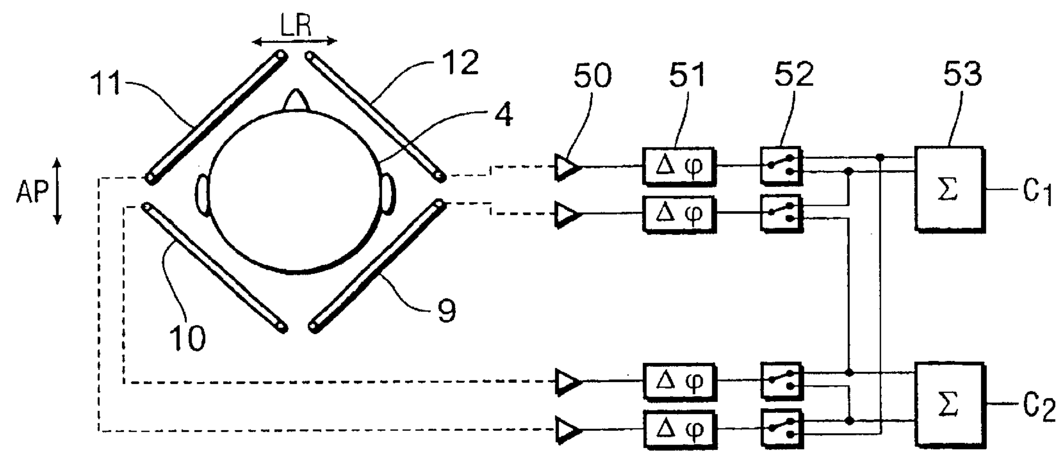
FIG. 4 shows a third embodiment of a head coil arrangement comprising four RF coils.

The described principle can be rendered software-controlled by means of software-controlled switches 52 and/or software-controlled phase shifters 51; these software-controlled switches 52 are shown in the embodiment of FIG. 4.

The magnetic resonance imaging apparatus shown by FIG. 4 includes an RF coil system having at least two sets of at least two RF coils 9, 10 and 11, 12 which detect RF signals from a region of interest, at least two receiver channels C1 and C2 which receive and process the detected RF signals, and a plurality of switches 52 that selectively route a first and a second detected RF signal from a first set of the at least two RF coils 9, 10 towards separate receiver channels C1 and C2 via different paths of at least two possible paths. A switch of the plurality of switches is positioned along each path of the at least two possible paths defining at least four possible paths, for selectively diverting the first and second detected RF signals along two different paths of the at least four possible paths. At least one selectively diverted first and second detected RF signal is combined with a respective detected RF signal from a second set of the at least two RF coils 11, 12 which has been selectively diverted by a different switch of the plurality of switches along another additional path depending on the imaging parameters to form combined signals within combining component 53. The additional path includes a portion of one of the two different paths of the at least four possible paths. The combined RF signals of component 53 are applied to separate receiver channels C1 and C2.

The principle shown in FIG. 4 can be extended in the z-direction, leading to at least eight individual RF coils 21 to 28. In each set of four RF coils 21, 22, 23, 24 and 25, 26, 27, 28 the combinations as shown in FIG. 4 can be formed.

Figure 5:
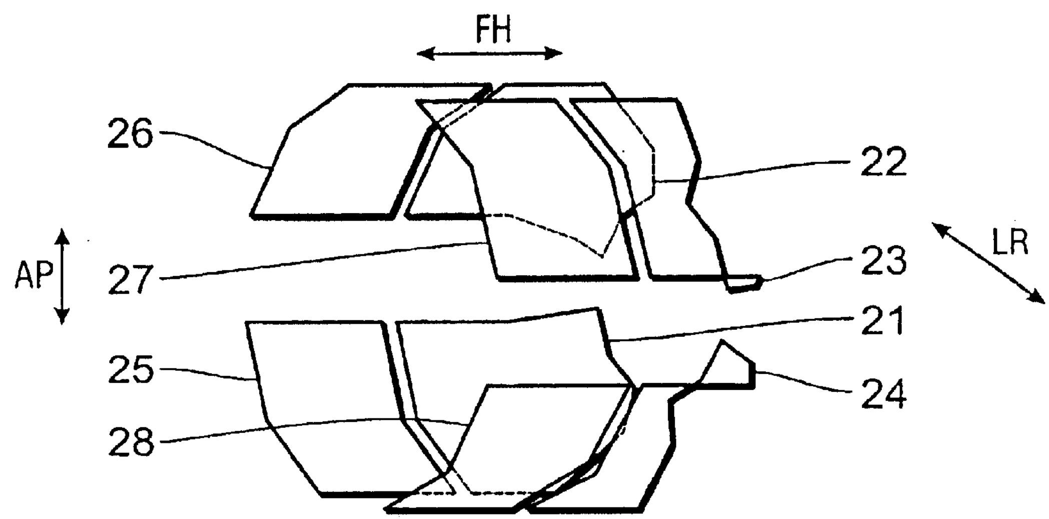
FIG. 5 shows a birdcage head coil arrangement comprising eight RF coils.

Some anatomical regions, such as the head, require a configuration of a set of multiple RF coils arranged around the object. An embodiment of such an RF coil system comprising a birdcage head coil arrangement with eight RF coils 21–28 is shown in FIG. 5. There is a split in the FH (Feet/Head) direction, because this direction will always be used as one of the reduction directions in a 3D MR application using the known sensitivity encoding method. As can be seen in FIG. 5, showing two times the configuration of FIG. 3, there are two sets of four coils, the first set comprising the coils 21, 22, 23, 24, while the second set comprises the coils 25, 26, 27, 28. The individual coils may be bent to achieve a better filling factor. Depending on the MRI examination to be performed the user has to be able to choose the phase encoding direction as the AP direction or the LR direction.

Figure 6:
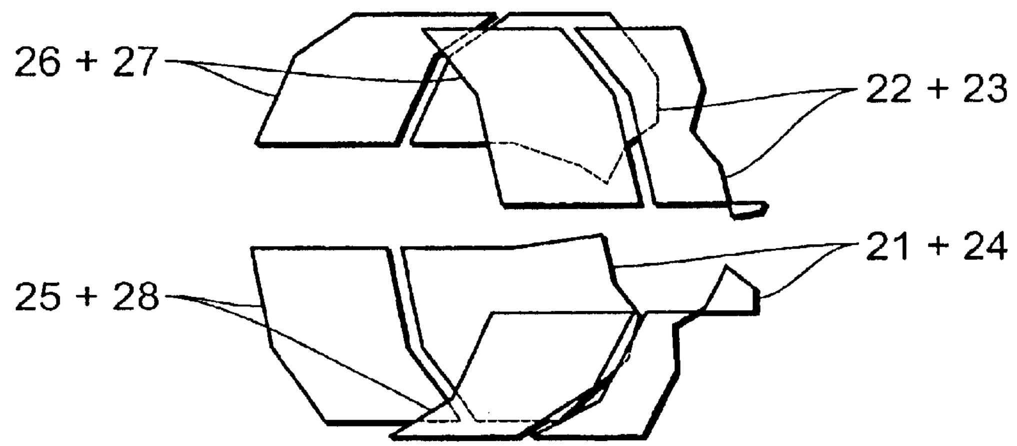
FIG. 6 shows the birdcage head coil arrangement so as to explain the combination of RF coils.

According to the invention some RF coils will be combined into one receiver channel depending on the desired foldover direction, which combination is controlled preferably by appropriate software. If the desired reduction direction is the AP direction, four pairs of RF coils are formed, each pair comprising two RF coils; the RF signals of the coils 21 and 24, 22 and 23, 25 and 28, 26 and 27 are thus combined as can be seen in FIG. 6. If, as an alternative, the desired reduction direction is the LR direction, the RF signals of the coils 21 and 22, 23 and 24, 25 and 26, 27 and 28 are combined according to the invention.

Figure 7:
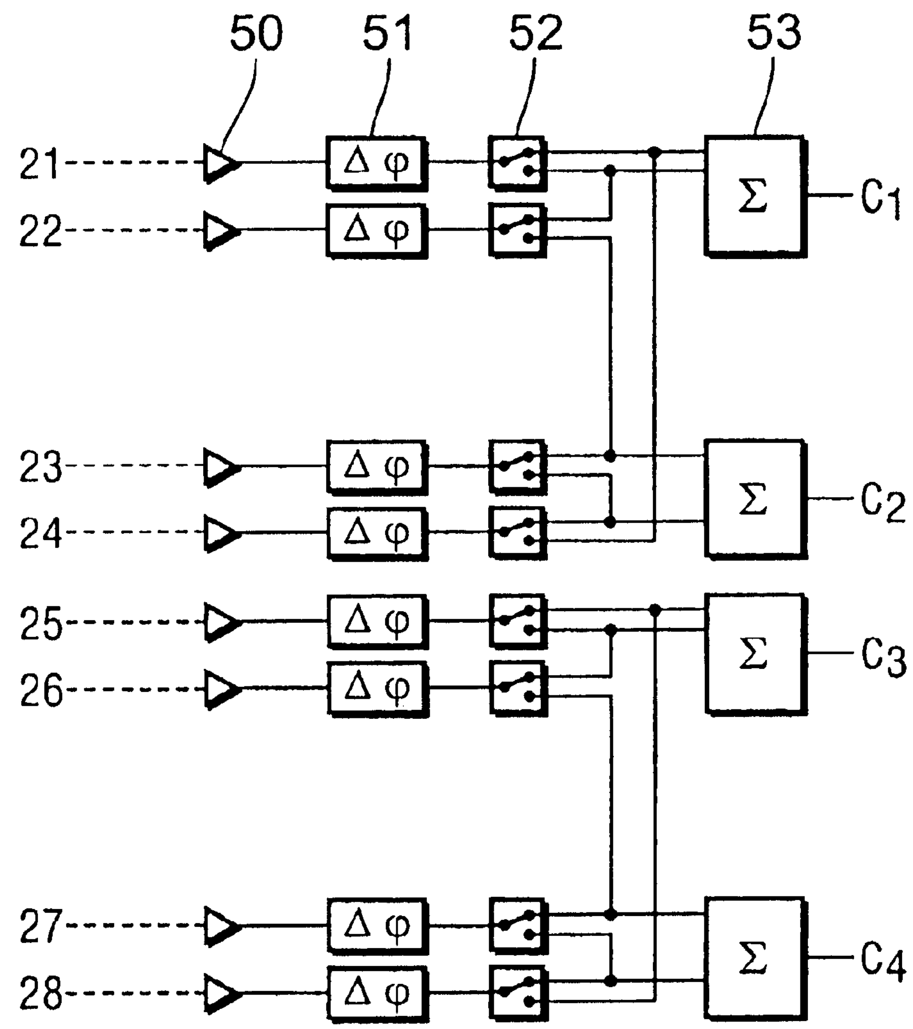
FIG. 7 shows a first embodiment of a control unit according to the invention.

FIG. 7 shows the arrangement of preamplifiers 50, phase shifters 51, software controlled switches 52 and RF adapters/combiners 53 for four receiver channels C1, C2, C3, C4 and eight RF coils 21 to 28 as used in the embodiment of FIG. 6.

It is to be noted that the positions of the phase shifters 51 and the switches 52 can be interchanged. Furthermore, the RF adder/combiner 53 and the phase shifter 52 can be realized as integrated circuits.

Figure 8:
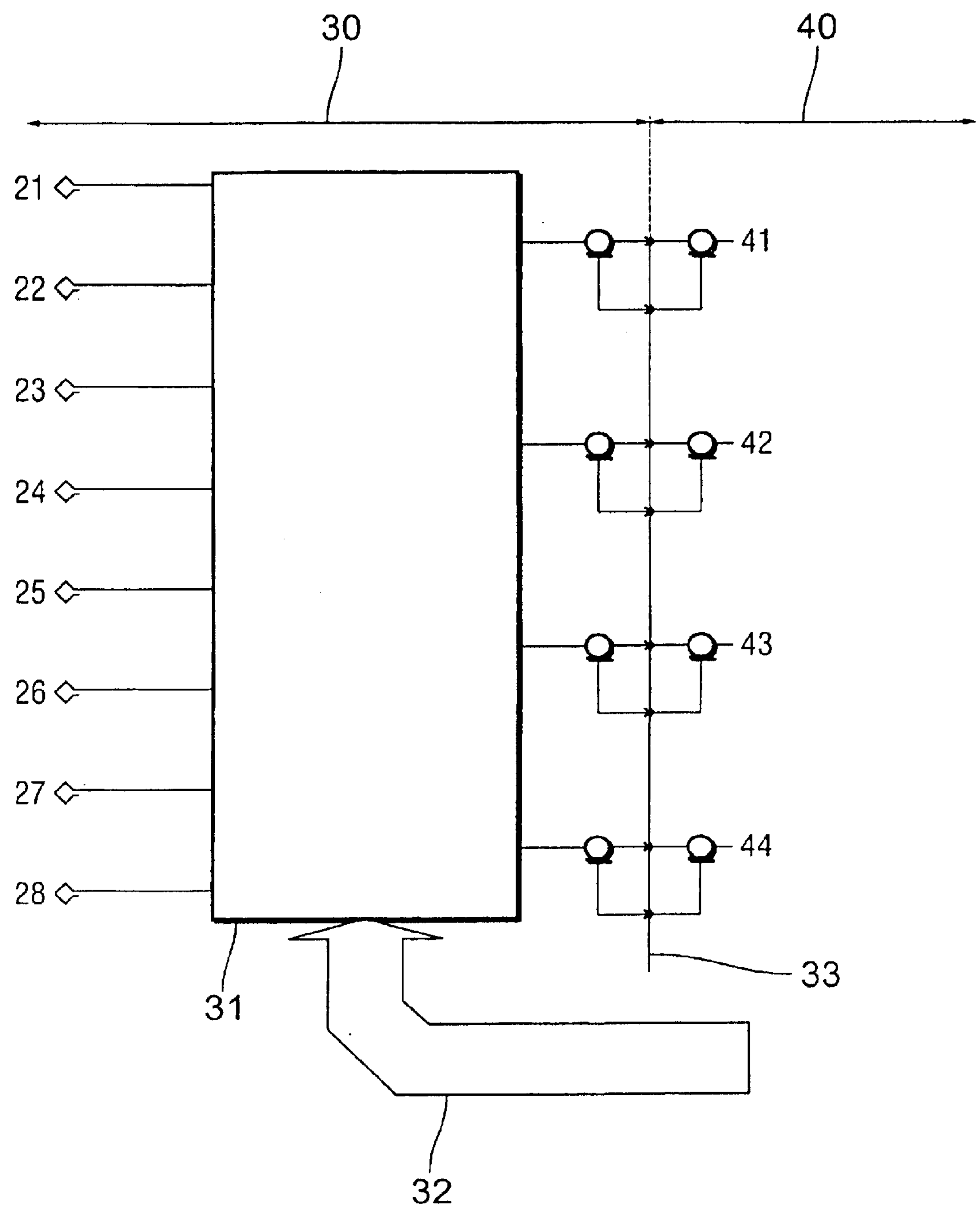
FIG. 8 shows a second embodiment of a control unit according to the invention.

The described combinations may require additional hardware that adds the two (or more) RF coil signals with or without some extra phase difference. A control unit in the form of a special software-controlled switch box for this function is shown in FIG. 8 which shows a control unit 31 having eight inputs for the RF signals of eight RF coils 21–28. Furthermore, the control unit 31 has an input for a software-controlled bus 32 for control signals and four outputs applying combined RF signals to four receiver channels 41, 42, 43, 44. These outputs also form the interface 33 between the RF coil system 30 and the processing system 40 of the MRI apparatus.

In the case of a head coil arrangement it is advantageous to tilt the head a little for reasons of comfort. This will lead to a slightly angulated situation. The preferred SENSE direction will now be angulated. The individual RF coils could also be tilted instead to overcome this problem.

It is also possible to arrange a large number of individual RF coils around an object and to combine only a few coils into several independent receiver channels. The channels which are not used will then be inactive. The coils to be used for forming each individual receiver channel (or a sensitivity profile) can be selected by the software-controlled bus utilizing the known SENSE directions (two directions simultaneously and in every possible offset and angulation).

The invention is not limited to the embodiments described above. Several further embodiments are possible. In particular, several variations of the number, the arrangement and the kind of RF coils are possible. Furthermore, the number of receiver channels is not limited to any specific number.

What is claimed is:

1. A magnetic resonance imaging apparatus comprising:

an RF coil system comprising at least two sets of at least two RF coils which detect RF signals from a region of interest, at least two receiver channels which receive and, process the detected RF signals, and a control unit which controls at least a plurality of switches, depending on the imaging parameters, that selectively route and/or divert a first and a second detected RF signal from a first set of the at least two RF coils towards separate receiver channels via different paths of at least two possible paths, where a switch of said plurality of switches is positioned along each path of said at least two possible paths defining at least four possible paths, the plurality of switches selectively diverting said first and second detected RF signals along two different paths of the at least four possible paths, wherein at least one selectively diverted first and second detected RF signal is combined with a respective detected RF signal from a second set of the at least two RF coils which has been selectively diverted by a different switch of said plurality of switches along another additional path and forms combined signals therefrom, wherein the additional path includes a portion of one of said two different paths of said at least four possible paths; and said control unit applies the combined RF signals to separate receiver channels.

2. A magnetic resonance imaging apparatus as claimed in claim 1, wherein said control unit is provided and combines the detected RF signals of several groups of the at least two RF coils into a separate receiver channel.

3. A magnetic resonance imaging apparatus as claimed in claim 1, wherein said RF coil system comprises two sets of four RF coils.

4. A magnetic resonance imaging apparatus as claimed in claim 1, wherein said RF coil system comprises a birdcage head coil arrangement.

5. A magnetic resonance imaging apparatus as claimed in claim 4, wherein said control unit is provided and combines the detected RF signals of RF coils arranged on opposite sides of the head.

6. A magnetic resonance imaging apparatus as claimed in claim 1, wherein said control unit is provided and combines the detected RF signals of neighboring RF coils.

7. A magnetic resonance imaging apparatus as claimed in claim 1, wherein said control unit which is provided selects and/or combines the detected RF signals of the at least two RF coils depending on the phase encoding direction.

8. A magnetic resonance imaging apparatus as claimed in claim 1, wherein said control unit which is provided selects and/or combines the detected RF signals of the at least two RF coils depending on the desired SENSE reduction direction.

9. A magnetic resonance imaging method, comprising the steps of:

detecting RF signals from a region of interest while using an RF coil system comprising at least two sets of at least two RF coils, receiving and processing the detected RF signals while using at least two receiver channels, controlling a plurality of switches depending on the imaging parameters that selectively route and/or divert a first and a second detected RF signal from a first set of the at least two RF coils towards separate receiver channels via different paths of at least two possible paths, where a switch of said plurality of switches is positioned along each respective path of said at least two possible paths defining at least four possible paths, wherein the plurality of switches selectively diverts said first and second detected RF signals along two different paths of said at least four possible paths, wherein at least one selectively diverted first and second detected RF signal is combined with a respective detected RF signal from a second set of the at least two RF coils which has been selectively diverted by a different switch of said plurality of switches along another additional path and forms combined signals therefrom, wherein the additional path includes a portion of one of said two different paths of said at least four possible paths; and applying the combined RF signals to separate receiver channels.

10. The method as claimed in claim 9, wherein said controlling step comprises the step of combining detected RF signals of several groups of the at least two RF coils into a separate receiver channel.

11. The method as claimed in claim 9, wherein said RF coil system comprises two sets of four RF coils.

12. The method as claimed in claim 9, wherein said RF coil system comprises a birdcage head coil arrangement.

13. The method as claimed in claim 12, wherein said controlling step combines the detected RF signals of RF coils arranged on opposite sides of the head.

14. The method as claimed in claim 9, wherein said controlling step combines the detected RF signals of neighboring RF coils.

15. The method as claimed in claim 9, wherein, said controlling step selects and/or combines the detected RF signals of the at least two RF coils depending on the phase encoding direction.

16. The method as claimed in claim 9, wherein said controlling step selects and/or combines the detected RF signals of the at least two RF coils depending on the desired SENSE reduction direction.

* * * * *